United States Patent [19]
Manning

[11] Patent Number: 5,831,929
[45] Date of Patent: Nov. 3, 1998

[54] MEMORY DEVICE WITH STAGGERED DATA PATHS

[75] Inventor: Troy A. Manning, Meridian, Id.

[73] Assignee: Micron Technology, Inc., Boise, Id.

[21] Appl. No.: 833,376

[22] Filed: Apr. 4, 1997

[51] Int. Cl.$^6$ .................................. G11C 7/00; G11C 8/00
[52] U.S. Cl. .............. 365/233; 365/189.02; 365/189.05; 365/194; 365/230.02; 365/230.08
[58] Field of Search .................................. 365/233, 189.2, 365/189.5, 194, 230.2, 230.8

[56] References Cited

U.S. PATENT DOCUMENTS

| | | | |
|---|---|---|---|
| 5,513,327 | 4/1996 | Farmwald et al. | 395/309 |
| 5,655,105 | 8/1997 | McLaury | 365/194 |

Primary Examiner—David C. Nelms
Assistant Examiner—Trong Phan
Attorney, Agent, or Firm—Seed and Berry LLP

[57] ABSTRACT

A memory device includes input and output data sequencers that transfer data between a memory array and a data bus where transfers between the data sequencers and the data bus are controlled by a first clock signal and transfers between a memory array and the data sequencers are controlled by a second clock signal of arbitrary phase relative to the first clock signal. Each data sequencer includes two or more sets of interim latches that each latch a portion of the data in a staggered fashion. One portion of the interim latches latch data while another portion transfers data to the data bus or the memory array. Because the data is segmented into portions and each portion is activated separately, the data can be transferred quickly without data collisions.

33 Claims, 10 Drawing Sheets

MEMORY DEVICE WITH STAGGERED DATA PATHS

TECHNICAL FIELD

The present invention relates to integrated memory devices and more particularly to data control in memory devices.

BACKGROUND OF THE INVENTION

Within a high-speed memory system 38, shown in FIG. 1, a synchronous memory device 40 performs operations, such as reading from or writing to a memory array 46, in a predetermined sequence. These operations are generally performed responsive to commands COM issued by a command generator, such as a memory controller 44. Timing of the commands and other signals outside of the memory device 40 is determined by an external clock signal CKEXT and a data clock DCLK that are produced by the memory controller 44.

It will be understood by one skilled in the art that the block diagram of FIG. 1 omits some signals applied to the memory device 40 for purposes of brevity. Also, one skilled in the art will understand that the commands COM may be control data within a control data packet or may be composed of a combination of command signals. In either case, the packet or combination of signals is commonly referred to as a command. The exact nature of these packets or signals will depend on the nature of the memory device 40, but the principles explained herein are applicable to many types of memory devices, including packetized DRAMs and other synchronous DRAMs.

Within the memory device 40, operations are controlled by a logic control circuit 42 responsive to the commands COM. In the packetized memory system 38 of FIG. 1, the logic control circuit 42 includes sequencing and decoding circuitry 45 and command latches 50. In a conventional memory system, the logic control circuit 42 may be conventional DRAM control logic.

Timing of operations within the memory device 40 is controlled by an internal clock signal CKINT that is produced by a delay-locked loop 62 and switching circuit 63 responsive to the external clock signal CKEXT. Timing of data latching in the memory device 40 is controlled by an internal latch signal LATCHW produced by a pulse generator 61 in response to the data clock DCLK.

Usually, operations within the memory device 40 must be synchronized to operations outside of the memory device 40. For example, commands and data are transferred into or out of the memory device 40 on command and data busses 48, 49, respectively, by clocking command and input data latches 50, 52 according to the internal clock signal CKINT and the internal latch signal LATCHW, respectively. However, as noted above, command timing on the command bus 48 and data timing on the data bus 49 are controlled by the external clock signal CKEXT and the data clock DCLK, respectively. Therefore, to transfer commands and data to and from the busses 48, 49 at the proper times relative to the external clock signal CKEXT, the internal clock signal CKINT is synchronized to the external clock signal CKEXT and the latch signal LATCHW is synchronized to the data clock DCLK.

To establish synchronization of the internal and external timing, the memory device 40 produces several phase-shifted clock signals CKINT-$\phi_X$ at respective taps of a delay-locked loop 62 responsive to the external clock signal CKEXT. Each of the phase-shifted clock signals CKINT-$\phi_X$ has a respective phase-shift $\phi_X$ relative to the external clock signal CKEXT. In response to commands COM from the memory controller 44, the logic control circuit 42 activates the switching circuit 63 to select one of the phase-shifted clock signals CKINT-$\phi_1$ as the internal clock signal CKINT. The selected phase-shifted clock signal CKINT-$\phi_1$ has a phase-shift $\phi_1$ corresponding to delays within the memory device 40 and propagation delays of the external clock signal CKEXT. Because the shifted internal clock signal CKINT-$\phi_1$ is synchronized to the external clock signal CKEXT, operations within the memory device 40 can be synchronized to commands and data arriving on the command bus 48 and data bus 49.

For reading, an I/O interface 54 under control of the logic control circuit 42 transfers 64 bits of data from a memory array 46 to an output latch circuit 81 synchronously with the internal clock signal CKINT. Then, the data are transferred in four groups from the output latch circuit 81 to the 16 line data bus 49 in response to an output latch signal LATCHR. The output latch signal LATCHR is a pulsed signal that is produced responsive to both rising and falling edges of the internal clock signal CKINT by an output vernier 57. The latch signal LATCHR has a frequency twice that of the internal clock signal CKINT because the output latch signal LATCHR is produced at both rising and falling edges of the internal clock signal CKINT. One skilled in the art will recognize that, for some applications, one of the other phase-shifted clock signals CKINT-$\phi_X$, may be input to the output vernier 57 instead of the internal clock signal CKINT.

The latch signal LATCHR has a phase shift $\phi_L$ relative to the external clock signal CKEXT that is selected to compensate for propagation delays between the memory device 40 and the memory controller 44. Thus, when the proper phase shift $\phi_L$ is selected, data output by the memory device 40 on an edge of the output latch signal LATCHR reach the memory controller 44 synchronously with an edge of the external clock signal CKEXT.

The phase shift $\phi_L$ will vary depending upon the configuration of the memory system 38. For example, the physical location of the memory device 40 relative to memory controller 44 will, in part, determine the phase shift $\phi_L$. To establish the appropriate phase shift $\phi_L$, the memory controller 44 monitors arrival of signals from the memory device 40 to determine their phase shift relative to the external clock signal CKEXT. In response to this determined "error," the memory controller 44 issues a command COM providing a phase correction. Then, in response to the command from the memory controller 44, the logic control circuit 42 activates the switching circuit 63 to select an appropriate tap of the delay-locked loop 62 to coarse adjust the latch signal phase $\phi^L$ or adjusts the output vernier 57 to fine adjust the output phase $\phi_L$.

During write operations data arrives on the data bus 49 synchronously with the data clock DCLK. The data clock signal DCLK has the same frequency as the external clock signal CKEXT; however, unlike the external clock signal CKEXT, the data clock signal DCLK is discontinuous, i.e., the data clock signal DCLK arrives in bursts of clock pulses as a block of data is accessed. Between bursts, the data clock signal DCLK is relatively inactive. Due to differences in propagation paths and circuit delays, the data clock signal DCLK is phase shifted relative to the external clock signal CKEXT and therefore arrives with an arbitrary phase shift relative to the external clock signal CKEXT. To latch the input data, the input data latches 52 are activated by an input latch signal LATCHW from the pulse generator 61 responsive to the data clock signal DCLK. Like the output vernier 57, the pulse generator 61 is also adjustable by the logic control circuit 42 to allow timing of the latches to be optimized. Data are then transferred to a set of 64 registers 67 and written to the memory array 46 responsive to the internal clock signal CKINT.

One problem that can occur at very high speed operation of the memory device 40 arises during reading from the memory array 46, as will now be described with reference to the timing diagram of FIG. 2. At high operating frequencies, data are "prefetched" from the memory array 46. That is, to prepare data for transfer to the data bus 49 on a given edge of the vernier-adjusted output latch signal LATCHR, sense amplifiers 90 in the I/O interface 54 read 64 bits of data D1PRE, D2PRE, D3PRE, D4PRE from the memory array 46 on a preceding edge of the internal clock signal CKINT. The first 16 bits of the prefetched data D1PRE are transferred to output latches 55 in the output latch circuit 81 at time $t_0$, on another edge of the internal clock signal CKINT. The first 16 bits of data D1PRE are held in the output latch circuit 81 until the next edge of the output latch signal LATCHR, when the data D1PRE are transferred to the data bus 49. The combination of prefetching responsive to edges of the internal clock signal CKINT and outputting data responsive to edges of the output latch signal LATCHR can make conventional pipelining techniques inadequate due, in part, to the variable phase difference between the signals CKINT, LATCHR.

As shown in the first and second graphs of FIG. 2, sixteen bits of the prefetched data are transferred to the latch circuit 81 at each edge (both rising and falling) of the internal clock signal CKINT. The data are then output responsive to the output latch signal LATCHR. As described above, the latch signal LATCHR may be phase shifted by any angle relative to edges of the internal clock signal CKINT. Although the phase shift is established by the memory controller 44, the phase shift is treated as arbitrary by the output latch circuit 81. Accordingly, the phase relationship between the internal clock signal CKINT and the latch signals LATCHR, LATCHW will be referred to herein as "arbitrary."

Two such phase shifts $\phi_1$, $\phi_2$ are shown in the fourth and fifth graphs of FIG. 2. If memory device 40 operates with the first phase shift $\phi_1$ 20 and the second sixteen bits of prefetched data D2PRE are transferred to the output latch circuit 81 prior to time $t_3$, data D1PRE from the preceding prefetch will have just left the output latch circuit 81 prior to time $t_3$.

If, however, the memory device 40 operates with the second phase shift $\phi_2$, the data D1PRE are still being transferred from the output latch circuit 81 to the data bus 49 at time $t_3$, as shown in the seventh graph of FIG. 2. Therefore, when the new prefetched data D2PRE arrive, the previously prefetched data D1PRE are still present. Such a "collision" of data at the output latch circuit 81 will typically cause data errors.

The above-described difficulties also occur during write operations. As noted above, in write operations, the latching is controlled by the input latch signal LATCHW which is derived from the data clock DCLK. But, writing to the array 46 is controlled by the internal clock signal CKINT. The phase of the data clock DCLK is determined by the memory controller 44 and may vary widely relative to the external clock CKEXT and the internal clock CKINT. Additionally, the data clock DCLK is discontinuous while the internal clock CKINT is continuous. Therefore, data arrive and are latched responsive to a discontinuous clock signal (DCLK) while data are transferred to the memory array 50 responsive to a continuous clock signal (CKINT) that is at a different phase. Again, this phase relationship will be referred to herein as "arbitrary."

Returning to FIG. 1, after the input data latches 52 latch input data responsive to the input latch signal LATCHW, the input data D1, D2 are then transferred from the input data latches 52 to a set of 64 write registers 67. Once the write registers 67 are loaded, the data are written to the memory array 46 responsive to the internal clock signal CKINT.

The use of a single set of registers 67 can once again cause collisions of data because to the arbitrary phase of the input latch signal LATCHW. For some phases of the input latch signal LATCHW, the latch signal LATCHW may activate the input data latches 52 while the registers 67 are loading the previously latched data. As before, such a collision of data can cause data errors or lost data.

One skilled in the art will recognize that the likelihood of data collisions can be reduced by decreasing the time required for the prefetch and for the transfer of data out of the latches 52, 55. However, this approach does not eliminate all collisions. Moreover, the minimum duration of each of these operations is limited by the response times of the various circuitry. Consequently, with increasing clock frequency, the likelihood of data collisions increase.

One approach to overcoming this problem is shown in FIG. 3, where a memory device 60 uses two sets of registers 55A, 55B in the output latch circuit 81. Data transfer from the I/O interface 54 to the registers 55A, 55B is controlled by respective output multiplexers 56. Referring once again to FIG. 2, the first set of data D1PRE are stored in the first set of registers 55A at time $t_0$. Then, the data D1PRE are transferred to the data bus 49 at time $t_1$ or $t_2$, depending upon the phase $\phi_L$ of the output latch signal LATCHR. For phase $\phi_2$, at time $t_3$ while the data D1PRE are being transferred to the data bus 49, subsequent data D2PRE are prefetched. The prefetched data D2PRE are then loaded into the second set of registers 55B. Because the subsequent data D2PRE are stored in a separate set of registers 55B, no data collision occurs.

In the approach of FIG. 3, each of the two sets of registers 55A, 55B includes enough registers to store all of the data D1PRE or D2PRE. For example, in a 64 bit system, each set will include 64 registers. The approach of FIG. 3 thus requires 128 output data registers and 64 sense amplifiers. The use of two registers 55A, 55B for each bit of data and the associated switching circuitry is expensive in terms of area consumption, power consumption, and complexity.

For writing data, the memory device 60 of FIG. 3 avoids data collisions by employing two sets of 64 input data latches 52A, 52B and two sets of 64 registers 67A. 67B coupled to the data bus 49 by a multiplexer 66. As shown in FIG. 4, the multiplexer 66 directs a first set of input data D1 into the first set of latches 52A at time $t_1$ responsive to a first edge of the data clock DCLK and directs a second set of data D2 to the second set of latches 52B at time $t_2$ responsive to a second edge of the data clock DCLK. The data D1 transfer to the first set of registers 67A at time $t_2$, as shown in the seventh graph of FIG. 4. While the data D1 are transferring from the latches 52A to the first set of registers 67A at time $t_2$, subsequent data D2 are latched into the second set of latches 52B. The second set of data D2 then transfers to the second set of registers 67B at time $t_3$. At the same time, the data D1 transfer from the register 67A to the array 46. At each subsequent edge of the internal clock signal CKINT the registers 67A, 67B alternately transfer data to the array 46. Because the data follow different paths, collisions are avoided.

As with the output latch circuit 81, the input latch circuit 88 includes 128 latches 52A, 52B. 128 registers 67A, 67B and associated circuitry. The use of two input latches 52A. 52B for each bit of data combines with the use of two output registers 55A, 55B to require the memory device 60 employs 256 latches 52A, 52B, 55A, 55B, making the memory device 60 expensive and difficult to produce.

SUMMARY OF THE INVENTION

A synchronous memory device receives an external clock signal from a memory controller and produces a phase shifted internal clock signal in response to the external clock signal. To allow the memory device to transfer data quickly between a data bus and a memory array, the memory device includes an input latch circuit and an output latch circuit. The output latch circuit includes a set of interim latches coupled to an I/O interface that reads data from and writes data to the memory array. Each of the interim latches corresponds to a sense amplifier in the I/O interface.

To transfer data from the array to the data bus, a first portion of the interim latches accepts data from the corresponding sense amplifiers on a first clock edge. During a first window following the first clock edge, the first portion of the interim latches transfers data through a series of multiplexers to the data bus. While data is being transferred from the first portion of the latches to the data bus, a second portion of the latches accepts data from the corresponding sense amplifiers. The second portion of the interim latches output their data to the data bus through the multiplexers in a second window immediately following the first window. While the second portion of the interim latches are being loaded, the first portion may be reloaded with new data.

Because the data from the sense amplifiers is segmented into a plurality of portions and output in a staggered fashion one portion at a time, data can be transferred from the memory array to the interim latches responsive to the internal clock signal and data are transferred from the interim latches to the data bus responsive to the external clock signal of arbitrary phase shift relative to the internal clock signal, without extra latches and without data collisions.

Like the output latch circuit, the input latch circuit also includes interim latches segmented into a plurality of portions. Input data are transferred from the data bus to the interim latches according to an externally provided data clock signal. Then, data are transferred from the interim latches to the memory array in a staggered fashion according to the internal clock signal of arbitrary phase. Once again, because the data are transferred between the data bus and the memory array in a staggered fashion, data collisions are avoided without requiring additional latches.

DETAILED DESCRIPTION OF THE INVENTION

Figure 1:
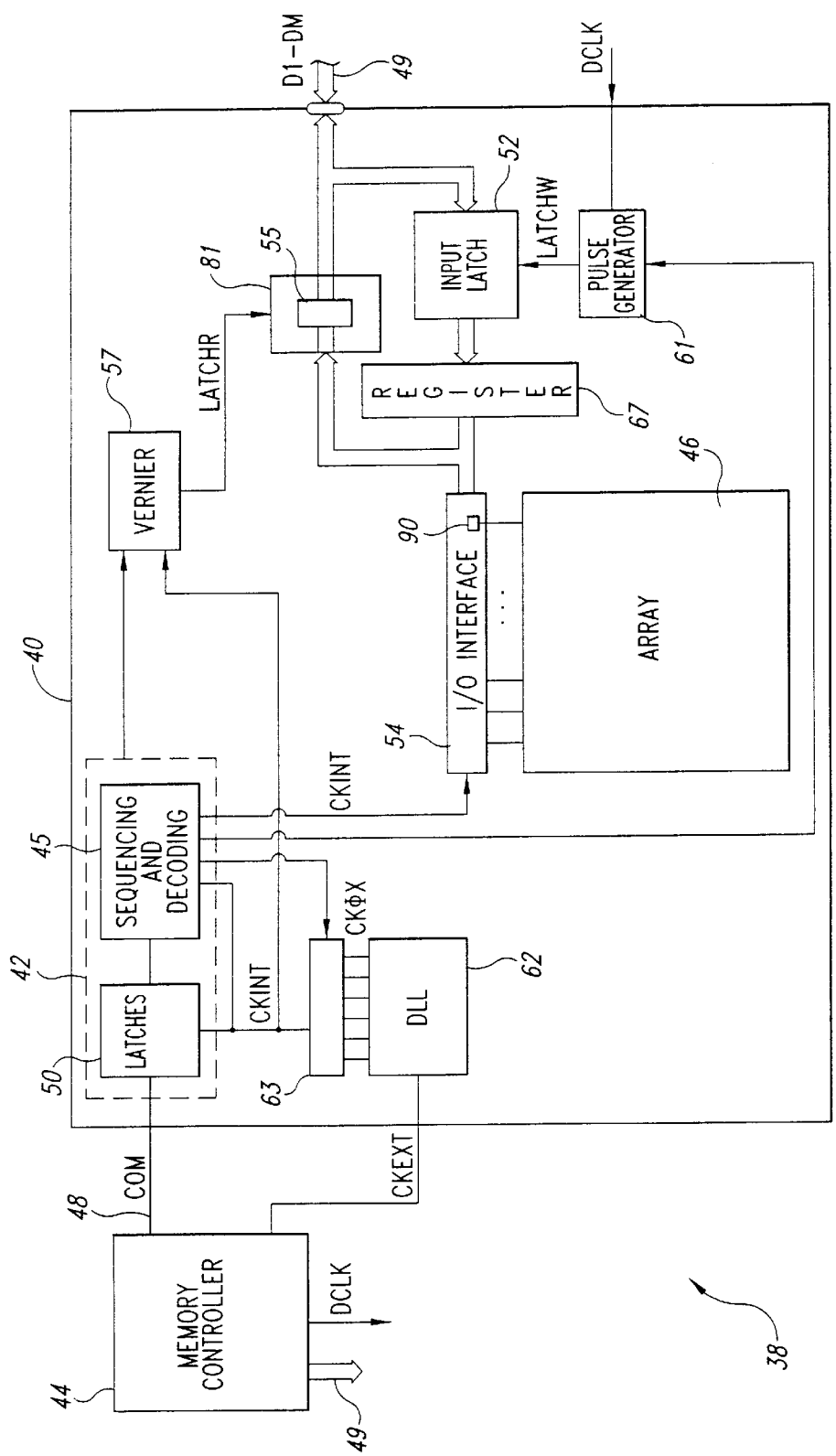
FIG. 1 is a block diagram of a prior art memory device driven by memory controller and including input and output latches.
Figure 2:
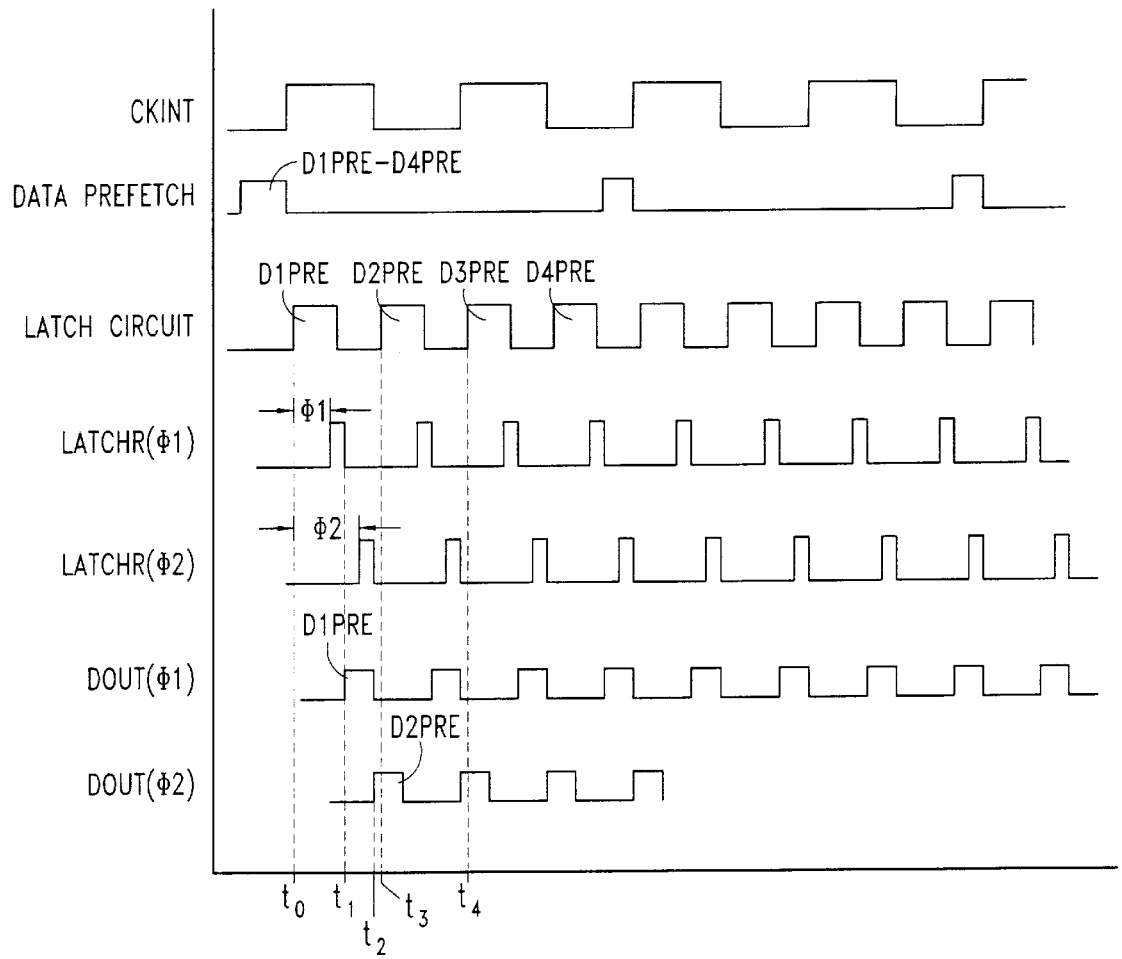
FIG. 2 is a signal timing diagram of selected signals within the memory device of FIG. 1.
Figure 5:
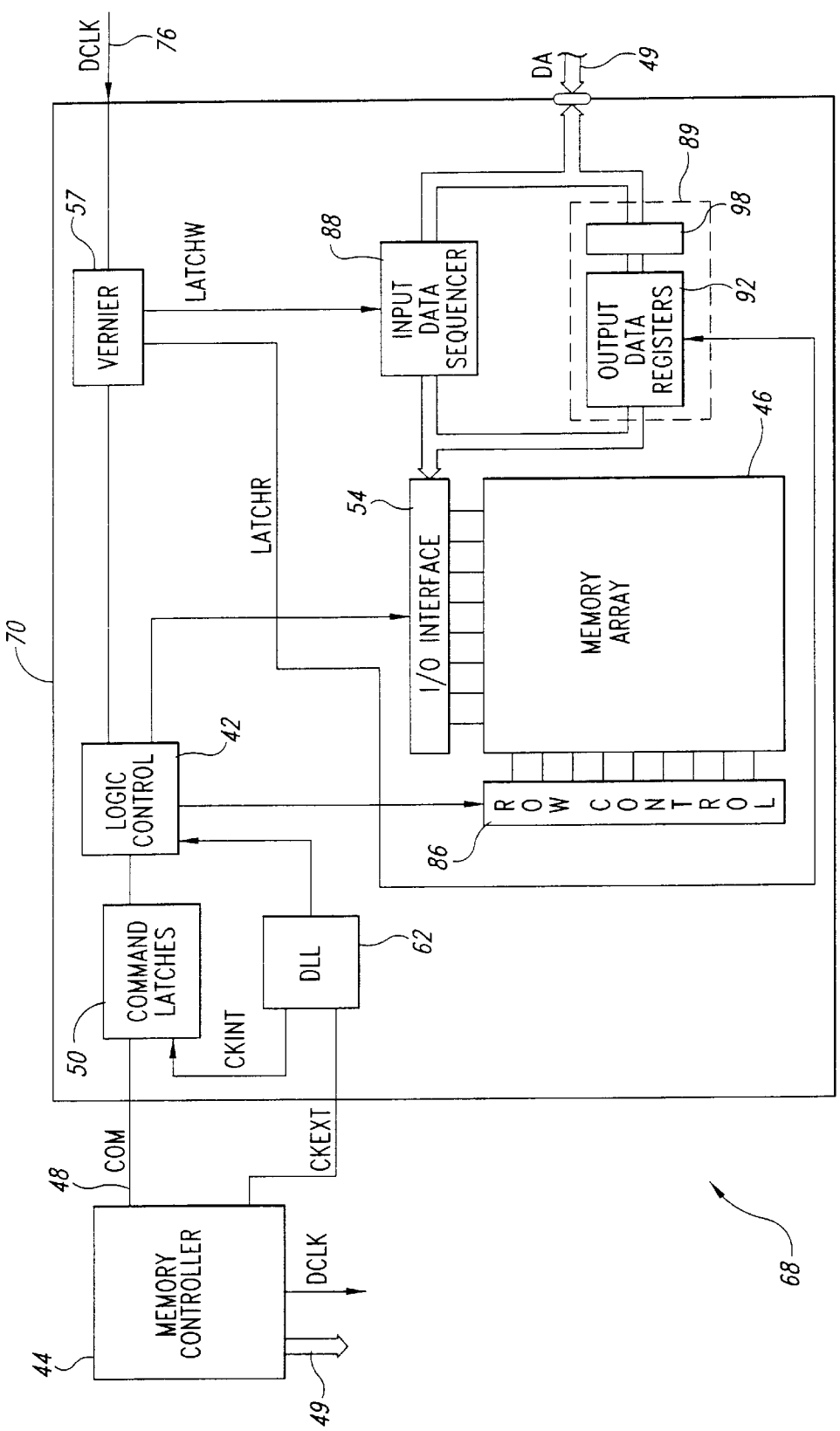
FIG. 5 is a block diagram of a memory device according to one embodiment of the invention including staggered output data registers and input data latches.

As shown in FIG. 5, a packetized memory system 68 includes a memory device 70 that operates under control of the memory controller 44. The memory device 70 includes several of the same components as the memory device 40 of FIG. 1, such as the memory array 46, the delay-locked loop 62, and the output vernier 57, where common elements are numbered identically. The memory controller 44 controls the memory device 70 through commands COM and the external clock signal CKEXT. The memory controller 44 also provides data DA to the memory device 70 over the 16-bit data bus 49, synchronously with the data clock signal DCLK.

Within the memory device 70, the command latches 50 receive the commands COM and forward them to the logic control circuit 42. The logic control circuit 42 establishes timing of operations within the memory device 70 responsive to the commands COM and the internal clock signal CKINT.

Because the memory device 70 is a packetized memory, the logic control circuit 42 is a command sequencer and decoder. One skilled in the art will recognize that the principles described herein are also applicable to other synchronous and asynchronous memory devices. For example, where the memory device 70 is a synchronous memory, the logic control circuit 42 may be a conventional control circuit.

The logic control circuit 42 activates the command latches 50 on edges of the internal clock signal CKINT to latch commands COM that arrive on the command bus 48 at edges of external clock signal CKEXT. Unlike the memory devices 40, 60 of FIGS. 1 and 3, the memory device 70 also includes an input data sequencer 88 that controls transfers of the data DA from the data bus 49 to the I/O interface 54 and an output data sequencer 89 that controls transfers of data from the I/O interface 54 to the data bus 49. Data transfer operations in the data sequencers 88, 89 are controlled by the latch signals LATCHR, LATCHW from the vernier 57. The latch signals LATCHR, LATCHW are pulsed signals at arbitrary phases relative to the external clock CKEXT as will be described below. To allow very rapid transfers of data, the latch signals LATCHR, LATCHW are produced responsive to both rising and falling edges of the internal clock signal CKINT and the data clock signal DCLK, respectively. Consequently, two pulses of the latch signals LATCHR, LATCHW typically occur during a single cycle of the internal clock signal CKINT.

The logic control circuit 42 controls transfers of data between the memory array 46 and the sequencers 88, 89 through the I/O interface 54 and row control circuit 86. As is conventional, the I/O interface 54 includes sense amplifiers, gating circuitry, isolation circuitry, precharge and equilibration circuitry, column select circuitry, and other conventional circuitry for reading to and writing from the memory array 46.

Figure 6:
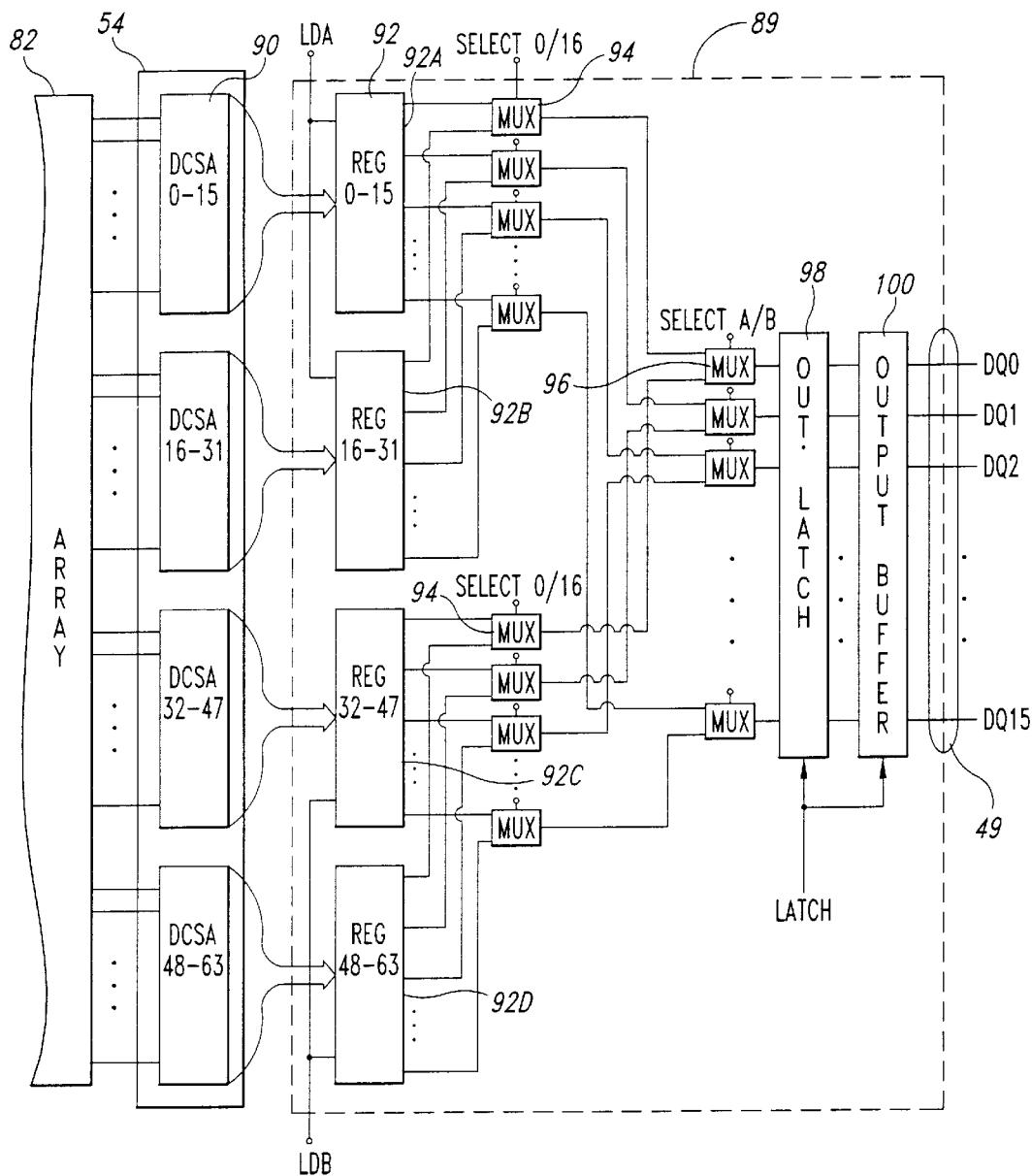
FIG. 6 is a block diagram of an output data path in the memory device of FIG. 5.

Referring to FIG. 6, the output data sequencer 89 includes upper and lower data paths, each containing two sets of interim registers 92A–92B, 92C–92D. A 64-bit data set from the memory array 46 is segmented into four 16-bit sets and each set is directed to a respective register set 92A–92D responsive to the internal clock signal CKINT. The registers 92A–92D output their data to a bank of multiplexers 94, 96 in response to the phase-shifted latch signal LATCHR. The multiplexers 94, 96 are activated by select signals SELECT A/B, SELECT 0/16 to output the data to the data bus 49 in four sets of 16 bits through an output latch 98 and buffer 100.

Figure 3:
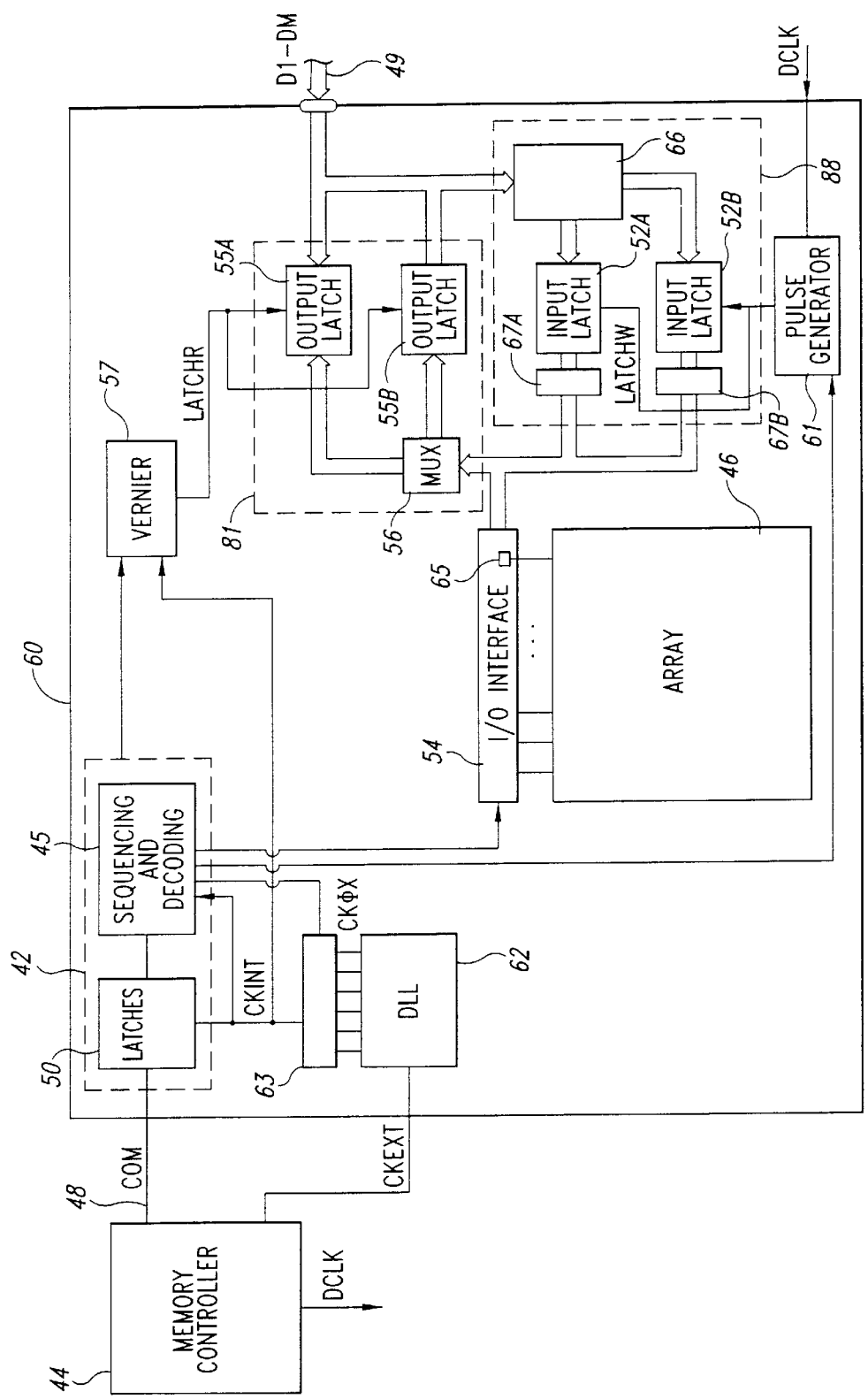
FIG. 3 is a block diagram of a prior art memory device driven by memory controller and including two sets of 64 output data registers and two sets of 64 input data latches.
Figure 4:
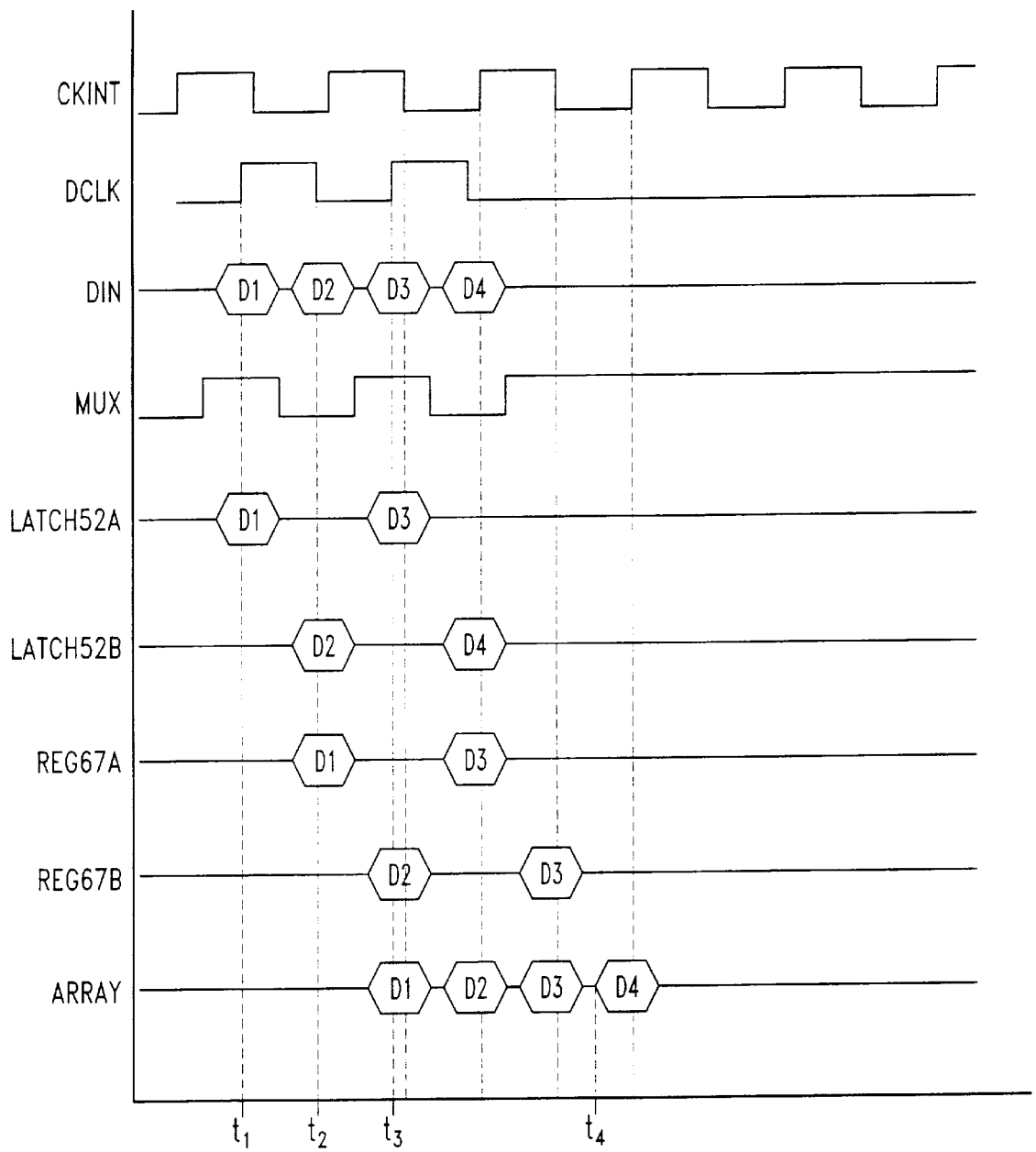
FIG. 4 is a signal timing diagram of selected signals within the memory device of FIG. 3.

Unlike the device 60 of FIG. 3, the output data sequencer 89 does not require two interim registers for each of the sense amplifiers 90. Instead, the output of each sense amplifier 90 drives a respective interim register 92. Also, 64 interim registers 92 are adequate for the 64-bit memory array 46, rather than the 128 latches 52A, 52B of the memory device 60.

Figure 7:
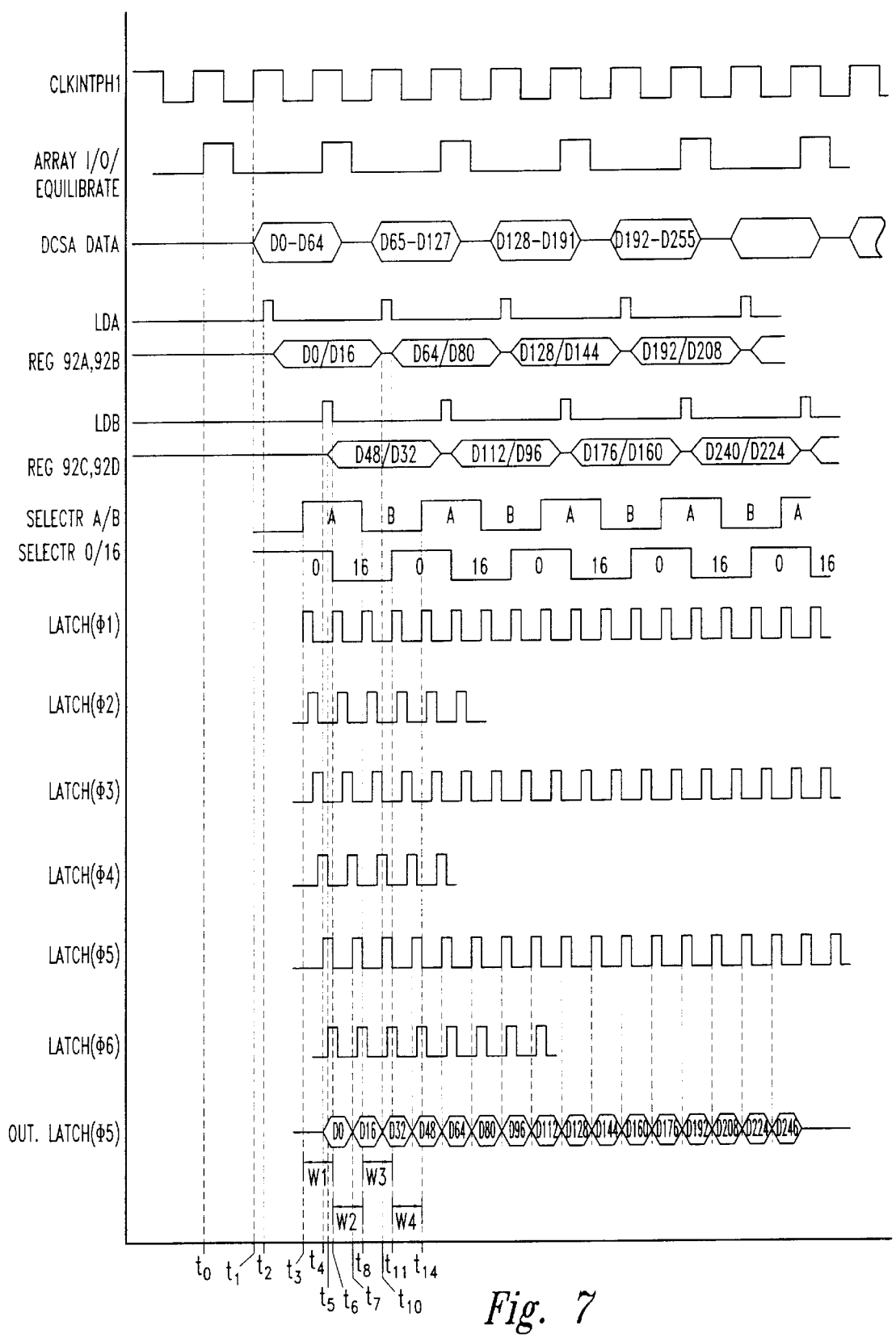
FIG. 7 is a signal timing diagram of selected signals in the output data path of FIG. 6.

Turning now to the timing diagrams of FIG. 7, timing of read operations in the output sequencer 89 of FIG. 6 will be described. For clarity of presentation, the I/O interface 54 is represented by 64 sense amplifiers 90 segmented into four banks, each containing 16 sense amplifiers 90. One skilled in the art will recognize that several components of the I/O interface 54, such as isolation transistors, column select circuitry, and precharge and equilibration circuitry have been omitted for ease of presentation. Also, except as noted below, timing within the output data sequencer 89 is referenced to rising and/or falling edges of the internal clock signal CLKINT, shown in the first graph of FIG. 7. As shown in the second graph of FIG. 7, reading is initiated by precharging and equilibrating the memory array 46 responsive to a precharge signal PRE at time $t_0$ shortly after rising edges of the internal clock signal CLKINT, to prepare the array 46 for reading. In response to a read command (not shown) at a previous clock edge, the 64 sense amplifiers 90 read data from respective locations in the memory array 46 at time $t_1$ to prepare for loading the interim registers 92.

Loading of the interim registers 92 is controlled by a pair of load signals LDA, LDB, where the first two register sets 92A, 92B (REG0–REG31) are controlled by the first load command LDA and the second two sets 92C, 92D (REG32–REG63) are controlled by the second load command LDB. At time $t_2$, shortly after time $t_1$, the logic control circuit 42 (FIG. 5) activates the first two sets of interim registers 92A, 92B with the first load command LDA. In response to the first load command LDA, the first two register sets 92A, 92B store the first 32 bits of the read data from the respective sense amplifiers 90. For example, as shown in the fifth graph of FIG. 7, the first and seventeenth registers store the first and seventeenth data bits D0, D16. The output of each the loaded registers 92 is then applied to a respective 2-to-1 multiplexer 94 controlled by a respective first read select signal SELECTR 0/16. In response to the first read select signal SELECTR 0/16, the multiplexers 94 output data from either the first register set 92A (REG0–15) or the second register set 92B (REG16–31). Initially, at time $t_1$, the first read select signal SELECTR 0/16 is high so that the multiplexers 94 initially output data from the first register set 92A. Since the first register set 92A contains the first sixteen bits of data, the multiplexers 94 output the first sixteen bits of data at time $t_2$.

The outputs of the multiplexers 94 are applied to a second bank of 2-to-1 multiplexers 96 controlled by a second read select signal SELECTR A/B. At time $t_3$, shortly after time $t_2$, the second read select signal SELECTR A/B transitions high.

Time $t_3$ defines the beginning of a "window" W1 during which the output latch signal LATCHR from the vernier 57 (FIG. 5) may arrive. As shown in the bottom graph of FIG. 7, the available window W1 extends between time $t_3$ and time $t_6$, which is one-half of a clock cycle of the internal clock signal CKINT. As described above, the phase $\phi_L$ of the output latch signal LATCHR is established by the output vernier 57 responsive to commands from the memory controller 44. The phase $\phi^L$ may vary between memory devices 70 and may vary over time to compensate for circuit variations, such as those that may be caused by aging or temperature variations. Examples of possible arrival times of the output latch signal LATCHR are shown for six different phases $\phi1$–$\phi6$ in the tenth through fifteenth graphs of FIG. 7.

Regardless of the phase of the output latch signal LATCHR, the second read select signal SELECTR A/B transitions high at time $t_3$. Also, at time $t_3$, the first select signal SELECTR 0/16 is high. Therefore, before the output latch signal LATCHR arrives, the output of the multiplexers 96 will be the first sixteen bits of data from the first set 92A (REG0–REG15). When the output latch signal LATCHR arrives, it activates the output latches 98 to latch data from the multiplexers 96. The output latches 98 activate the buffer 100 to provide data D0–D16 to the data bus 49. The arrival of the latch signal LATCHR, and thus the output of the data D0–D16, may occur at any time during the first window W1, as represented by the six different output latch signals LATCHR in FIG. 7. However, since the timing of the latch signal LATCHR is referenced to the external clock signal CKEXT as described above, the data D0–D16 will arrive at the controller 44 on edges of the external clock CKEXT.

At time $t_4$, which is also during the first window W1, a pulse of the second load command LDB arrives at the remaining two register sets 92C, 92D (REG32–REG63) thereby latching data from the remaining 32 sense amplifiers 90. For example, as shown in the seventh graph of FIG. 7, the first registers 92 in the third and fourth register sets 92C. 92D receive data D48, D32, respectively at time $t_5$. Thus, the third and fourth register sets 92C, 92D are loaded with data D32–D63 while the data D0–D15 in the first register set 92A are being output to the output latches 98.

Times $t_6$–$t_8$ define a second window W2 during which a second pulse of the output latch signal LATCHR may arrive. At time $t_6$, the first read select signal SELECTR 0/16 transitions low and the second select signal SELECTR A/B remains high so that the multiplexers 96 output data D from the second register set 92B. Consequently, the output latches 98 and buffer 100 output the data D16–D32 at time $t_7$ in response to the latch signal LATCHR.

A new window W3 begins at time $t_8$ and extends until time $t_{11}$. At time $t_8$, the second select signal SELECTR A/B transitions low while the first select signal SELECTR 0/16 remains low. Therefore, during the third window W3, output data from the multiplexers 96 will be from the fourth register set 92D (REG48–REG63). Consequently, when the output latch signal LATCHR pulses high during the third window W3, the output latches 98 and buffer 100 output data D48–D63 from the lowermost 16 sense amplifiers 90.

A fourth window W4 occurs between times $t_{11}$ and $t_{14}$. At the beginning of the fourth window W4 at time $t_{11}$, the first read select signal SELECTR 0/16 transitions high to switch the multiplexers 94 while the second read select signal SELECTR A/B remains low. Consequently, the second set of multiplexers 96 outputs data from the third register set 92C during the fourth window W4. Also, when the pulse of the output latch signal LATCHR arrives in the fourth window W4, the output latches 98 and buffer 100 output the data D32–D47 from the third register set 92C to the data bus 49.

As can be seen in the sixth graph of FIG. 5, in response to the second load signal LDB at $t_4$, data were loaded into the third and fourth register sets 92C, 92D at approximately time $t_5$. Because no additional pulses of the second load signal LDB arrive between times $t_6$ and $t_{14}$, the data transferred from the third register set 92C during the fourth window W4 are the data originally sensed by the sense amplifiers 90 at time $t_2$. The data D32–D47, D48–D63 from the third and fourth register sets 92C, 92D are then output on the next two pulses of the latch signal LATCHR, respectively.

While the above-described data transfers are occurring, a second pulse of the first load signal LDA arrives at the first two register sets 92A, 92B at time $t_{10}$, thereby loading new data into the first 32 registers 92 (REG0–REG31). Because the second read select signal SELECTR A/B is low during the third window W3, the loading of data into the first 32 registers 92 has no effect on the data seen by the output latches 98. One skilled in the art will recognize that data from the sense amplifiers 90 can be transferred continuously to the data bus 49 at successive half-cycle intervals (i.e., during each window W1–WN). Thus, during two cycles of the internal clock signal CKINT, 64 bits of data are output to the data bus in four groups of 16, where each group reaches the data bus 49 during a respective window W1–W4.

Unlike the memory device 60 of FIG. 3, the memory device 70 utilizes only 64 registers in the output data path while avoiding data collisions. This results from the staggered latching of the 64-bits of data by the register sets 92A–D and the staggered transfer of the data from the register sets 92A–D to the dot latch 98, i.e., while a first half of the data (from the first two register sets 92A, 92B) is being transferred to the output latches 98, the second half of the data is being loaded into the third and fourth register sets 92C, 92D. Conversely, while the second half of the data transfers from the third and fourth register sets 92C, 92D to the output latches 98, the first half of a new set of data is being loaded into the first and second register sets 92A, 92B.

Figure 8:
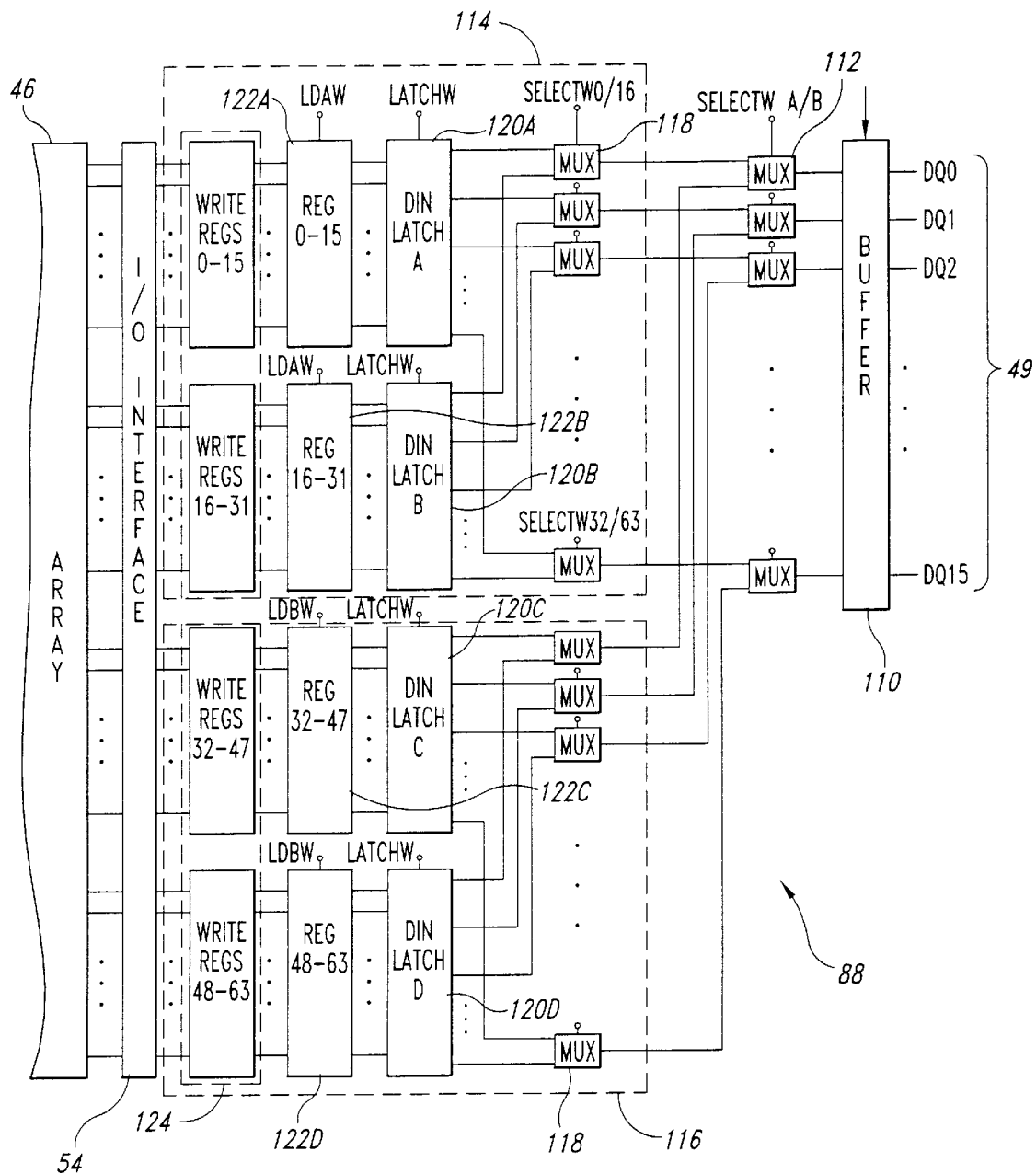
FIG. 8 is a block diagram of an input data path in the memory device of FIG. 5.
Figure 9:
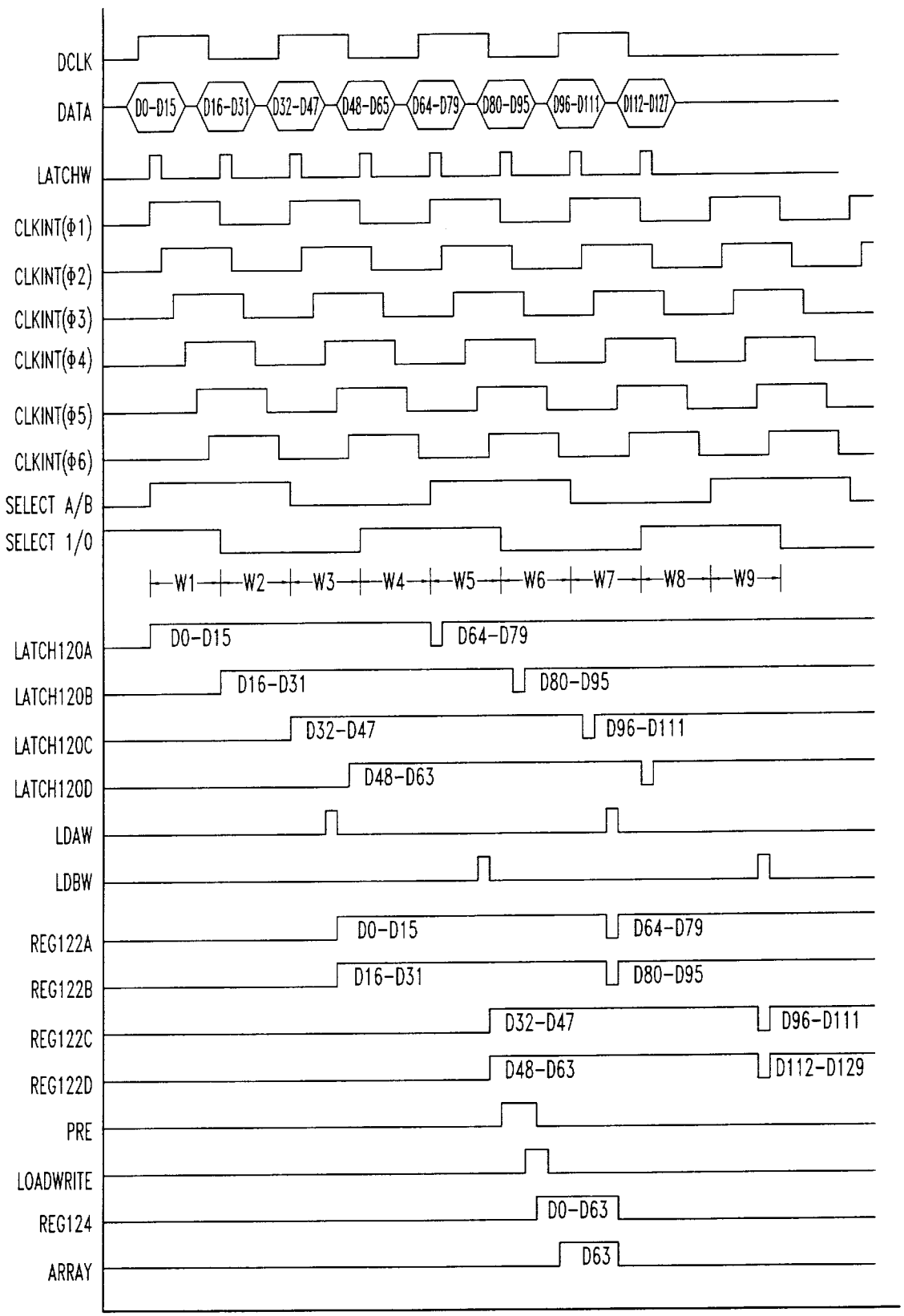
FIG. 9 is a signal timing diagram of selected signals in the input data path of FIG. 8.

Turning now to FIGS. 8 and 9, writing data to the memory array 46 will now be described. Like the output data sequencer 89, the input data sequencer 88 uses a plurality of data paths operated in a staggered fashion to eliminate data collisions. Initially, a 64-bit data packet arrives on the 16-line data bus 49 in four groups of sixteen bits. The data are applied to a buffer circuit 110 that translates voltage levels on the data bus 49 to the appropriate voltage levels for operations within the memory device 70. Each of the 16 outputs of the buffer 110 is then applied to a respective one-to-two multiplexer 112 controlled by a first write select signal SELECTW A/B that controls whether the data are applied to an upper portion 114 or a lower portion 116 of the input sequencer 88. If the first write select signal SELECTW A/B is high, the multiplexers 112 output data to input multiplexers 118 in the upper portion 114. If the first write select signal SELECTW A/B is low, the multiplexers 112 output data to input multiplexers 118 in the lower portion 116. The upper portion 114 corresponds to the first 32 bits of data and the lower portion 116 corresponds to the second 32 bits of data. Thus, the first write select signal SELECTW A/B indicates whether arriving data is in the first or second half of the 64-bit data packet.

Each of the input multiplexers 118 is controlled by a second write select signal SELECTW 0/16. In the upper portion 114, the first set of multiplexers 118 outputs data to first or second latch sets 120A, 120B and in the lower portion 116, the second set of multiplexers output data to fourth or third latch sets 120D, 120C, depending upon the state of the second write select signal SELECTW 0/16. One skilled in the art will recognize that the select signals SELECTW 0/16, SELECTW A/B thus form a binary count controlling whether data from the buffer 110 transfers to the first, second, third, or fourth latch sets 120A–D.

As described above, the data arrive at the data bus 49 substantially synchronized to the data clock DCLK and are latched by the input latch signal LATCHW, which is phase shifted relative to the data clock DCLK by a phase $\phi_{LW}$. However, the data are transferred to the memory array 46 responsive to the internal clock signal CKINT. As noted above, the input latch signal LATCHW may have any phase relative to the internal clock signal CKINT, as represented by the fifth through tenth graphs of FIG. 9.

As with the output data sequencer 89, the input data sequencer 88 also uses a window approach to compensate for the phase difference between the internal clock signal CKINT and the input latch signal LATCHW. However, in the input data sequencer 88, the windows W1–WN are defined relative to edges of the data clock DCLK, rather than relative edges of the internal clock signal CKINT.

Also, unlike the output data sequencer 89, in the input data sequencer 88, the select signals SELECTW 0/16, SELECTW A/B are initiated by pulses of the latch signal LATCHW. Since the duration of the four windows W1–W4 equals the duration of two clock cycles, each window W1–W4 includes an edge (rising or falling) of the internal clock signal CKINT. Thus, each latch 120 in each set 120A–120D receives one bit of data in one of the first four windows W1–W4.

During the first window W1, the write select signals SELECTW A/B, SELECT 0/16 are both high so that the first set of latches 120A latch the first sixteen bits of data D0–D15, as shown in the twelfth graph of FIG. 9. During the second window W2, the first write select signal SELECTW A/B remains high and the second write select signal SELECTW 0/16 transitions low. Thus, during the second window W2, the second set of latches 120B latch the second sixteen bits of data D16–D31.

During the third window W3, the third set of latches 120C latch a third portion of the data D32–D47. Also during the third window W3, a load signal LDAW pulses high to load data from the first two latch sets 120A, 120B into two sets of interim registers 122A, 122B. Because the first select signal SELECTW A/B is low during the third window W3, no data are being transferred from the multiplexers 118 to the first and second latch sets 120A, 120B. Consequently, sixteen bits of data D32–D47 enter the third latch set 120C and thirty-two bits of data D0–D31 transfer from the first and second latch sets 120A, 120B to the first and second interim register sets 122A, 122B, without any data collisions.

During the fourth window W4, the remaining 16 bits of data D48–D63 are latched by the fourth set of latches 120D so that, by the end of the fourth window W4, the third and fourth latch sets 120C, 120D are fully loaded. Then, during the fifth window W5, the second load signal LDBW pulses high to transfer data from the latches 120C, 120D to the third and fourth register sets 122C, 122D. Because the first select signal SELECTW A/B is high during the fifth window W5, no data is loaded into the third and fourth latch sets 120C, 120D and data collisions are avoided.

Also during the fifth window W5, while the data are being transferred from the third and fourth latch sets 120C, 120D to the third and fourth register sets 122C, 122D, new data D64–D79 are being latched into the first latch set 120A because the first select signal SELECTW A/B is high.

It should be noted that timing of the load signals LDAW, LDBW is controlled by the internal clock signal CLKINT. However, timing of the latch signal LATCHW and the select signals SELECTW A/B, SELECTW 0/16 are controlled by the vernier shifted data clock DCLK. Consequently, although the load signals LDAW, LDBW occur within their respective windows W1–W4, the location of the pulses of the load signals LDAW, LDBW within the windows W1–W4 may vary.

Timing of further data transfers within the input data sequencer 88 is controlled by the internal clock signal CLKINT. For example, precharge and equilibration of the array 46 occurs within the fifth window W5 responsive to the precharge signal PRE which is derived from the internal clock signal CLKINT. After the array 46 is precharged and equilibrated, all of the register sets 122A–122D transfer their data to a set of write registers 124 responsive to a write load signal LOAD-WRITE, as shown in the twenty-third and twenty-fourth graphs of FIG. 9. Once the write registers 124 are loaded, the I/O interface 54 writes data to the selected memory location as shown in the lowermost graph of FIG. 9.

Figure 10:
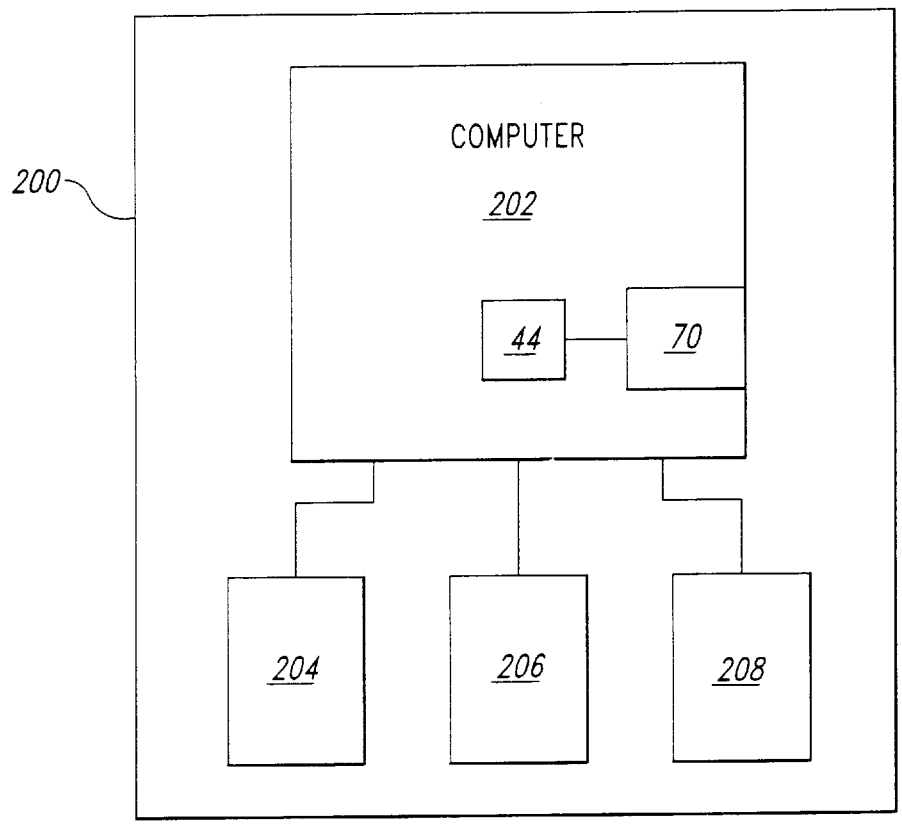
FIG. 10 is a block diagram of a computer system including the memory controller and memory device of FIG. 3.

FIG. 10 is a block diagram of a computer system 200 that contains the memory device 70 and memory controller 44 of FIG. 5. The computer system 200 includes a computer circuit 202, such as a microprocessor, for performing computer functions such as executing software to perform desired calculations and tasks. The computer system 200 also includes command and data buses 210 to activate the memory controller 44. One or more input devices 204, such as a keypad or a mouse, are coupled to the processor 202 and allow an operator to manually input data thereto. One or more output devices 206 are coupled to the processor 202 to display or otherwise output data generated by the processor 202. Examples of output devices include a printer and a video display unit. One or more data storage devices 208 are coupled to the processor to store data on or retrieve data from external storage media (not shown). Examples of storage devices 208 and storage media include drives that accept hard and floppy disks, tape cassettes and compact-disk read-only memories.

From the foregoing it will be appreciated that, although specific embodiments of the invention have been described herein for purposes of illustration, various modifications may be made without deviating from the spirit and scope of the invention. For example, if the response time of the array 46 is sufficiently short, the write registers 124 may be eliminated and data can be written directly from the registers 122A–D to the array 46 in two portions. Accordingly, the invention is not limited except as by the appended claims.

I claim:

1. A synchronous memory device responsive to a first clock signal, comprising:

a memory array including a plurality of memory cells arranged in rows and columns;

an I/O interface coupled to the memory array, the I/O interface including a plurality of inputs each coupled to a respective column or row and a plurality of I/O terminals;

a first set of interim storage latches, each having a first activation input, a first latch output and a first latch input each first latch input being coupled to a respective I/O terminal, each interim storage latch in the first set being responsive to a first activation signal at the first activation input to latch data from the respective I/O terminal;

a second set of interim storage latches, each having a second activation input, a second latch output and a second latch input, each second latch input being coupled to a respective I/O terminal, each interim storage latch in the second set being responsive to a second activation signal at the second activation input to latch data from the respective I/O terminal;

a multiplexing circuit having a set of first multiplexer inputs each coupled to a respective first latch output and a set of second multiplexer inputs each coupled to a respective second latch output, the multiplexing circuit further including a plurality of multiplexer outputs, each multiplexer output being coupled to a respective device output terminal, the multiplexing circuit further including a control input terminal, the multiplexing circuit being responsive to a first control signal at the control input to couple the first multiplexer inputs to the multiplexer outputs and responsive to a second control signal at the control input to couple the second multiplexer inputs to the multiplexer outputs; and a timing control circuit having a clock input to which the first clock signal, a first activation output coupled to the first activation input a second activation output coupled to the second activation input, a control output coupled to the control input, the timing control circuit being responsive to the first clock signal to produce the first activation signal at the first activation output and the second activation signal at the second activation output, the timing control circuit further being responsive to the clock signal to provide the first control signal to the first control input during a first portion of a selected clock cycle and to provide the second control signal to the control input during a second portion of the selected clock cycle.

2. The memory device of claim 1 wherein the first set of latches includes a first half and a second half, each of the first and second halves including a respective group of interim latches coupled to respective ones of the I/O terminals, the memory device further including a first intermediate set of multiplexers coupled between the first set of interim storage latches and the multiplexing circuit, each multiplexer in the first intermediate set having a first intermediate multiplexer input coupled to a respective latch in the first half, a second intermediate multiplexer input coupled to a respective latch in the second half and an intermediate multiplexer output coupled to a respective first multiplexer input.

3. The memory device of claim 2 wherein the second set of latches includes a third half and a fourth half, each of the third and fourth halves including a respective group of interim latches coupled to respective ones of the I/O terminals, the memory device further including:

a second intermediate set of multiplexers coupled between the third set of interim storage latches and the multiplexing circuit, each multiplexer in the second intermediate set having a third intermediate multiplexer input coupled to a respective latch in the third half, a fourth intermediate multiplexer input coupled to a respective latch in the fourth half and an intermediate multiplexer output coupled to a respective second multiplexer input.

4. The memory device of claim 3, further including:

a set of command terminals coupled to the timing control circuit, the timing control circuit being responsive to commands at the command terminals to activate the first, second third and fourth halves in a predetermined sequence.

5. The memory device of claim 4 wherein the timing control circuit is responsive to the first clock signal to activate the first, second third and fourth halves in a predetermined sequence and responsive to a second clock signal having an arbitrary phase shift relative to the first clock signal to produce the first and second control signals.

6. A synchronous memory device responsive to a data clock signal and an external clock signal having a phase shift relative to the data clock signal, comprising:

a memory array including a plurality of memory cells arranged in rows and columns;

an I/O interface coupled to the memory array, the I/O interface including a plurality of outputs each coupled to a respective column or row and a plurality of I/O terminals;

a data bus;

a multiplexing circuit having a set of multiplexer inputs each coupled to the data bus, a plurality of first multiplexer outputs, and a plurality of second multiplexer outputs, the multiplexing circuit further including a control input terminal, the multiplexing circuit being responsive to a first control signal at the control input to couple the multiplexer inputs to the first multiplexer outputs and responsive to a second control signal at the control input to couple the multiplexer inputs to the second multiplexer outputs;

a first set of interim input storage latches, each having a first activation input, a first latch output and a first latch input, each first latch input being coupled to a respective first multiplexer output, each interim input storage latch in the first set being responsive to a first activation signal at the first activation input to latch data from the respective first multiplexer output;

a second set of interim storage latches, each having a second activation input, a second latch output and a second latch input, each second latch input being coupled to a respective second multiplexer output, each interim storage latch in the second set being responsive to a second activation signal at the second activation input to latch data from the respective second multiplexer output;

a first set of registers, each having a first load input, a first register input coupled to a respective first latch output and a first register output coupled to a respective I/O terminal, each register in the first set being responsive to a first load signal at the first load input to load data from the respective first latch output;

a second set of registers, each having a load input, a first register input coupled to a respective first latch output and a first register output coupled to a respective I/O terminal, each register in the second set being responsive to a second load signal at the second load input to load data from the respective second latch output; and a timing control circuit having a first clock input to which the external clock signal, a second clock input to which the data clock signal may be applied, a first load output coupled to the first load inputs, a second load output coupled to the second load inputs, a first control output coupled to the first control inputs, a second control output coupled to the second control inputs, a first activation output coupled to the first activation input, and a second activation output coupled to the second activation input, the timing control signal being responsive to the data clock signal to produce the first and second activation signals, the timing control signal further being responsive to the external clock signal to produce the first and second load signals.

7. The memory device of claim 6 wherein the first set of latches includes a first half and a second half, each of the first and second halves including a respective group of interim latches coupled to the data bus, wherein the memory device further includes:

a first intermediate set of multiplexers coupled between the first set of interim storage latches and the multiplexing circuit, each multiplexer in the first intermediate set having an intermediate multiplexer input coupled to the multiplexing circuit, a first intermediate multiplexer output coupled to a respective latch in the first half, and a second intermediate multiplexer output coupled to a respective latch in the second half.

8. The memory device of claim 7 wherein the second set of latches includes a third half and a fourth half, each of the third and fourth halves including a respective group of interim latches coupled to respective ones of the registers, the memory device further including a second intermediate set of multiplexers coupled between the third set of interim storage latches and the multiplexing circuit, each multiplexer in the second intermediate set having an intermediate multiplexer input coupled to the multiplexing circuit, a third intermediate multiplexer output coupled to a respective latch in the third half, and a fourth intermediate multiplexer output coupled to a respective latch in the fourth half.

9. The memory device of claim 8 wherein the timing control circuit is responsive to activate the first, second third and fourth halves in a predetermined sequence.

10. A synchronous memory device responsive to an externally supplied clock signal at a first phase, a data clock signal at any of a plurality of second phases different from the first phase, and externally supplied commands, comprising:

a clock converter circuit responsive to the externally supplied clock signal to produce an internal clock signal;

a memory array including a plurality of memory cells arranged in rows and columns;

an I/O interface coupled to the memory array, the I/O interface including a plurality of inputs each coupled to a respective column or row of the array and a plurality of I/O output terminals including a first portion and a second portion, the I/O interface retrieving data from the memory array in response to a read command;

data terminals that may be coupled to a data bus;

a first output data path coupled between the first portion of the I/O terminals and the data terminals, the first output data path including a first switching control terminal and a first latching input, the first output data path being responsive to a first switching signal at the first switching control terminal to receive data from the first portion of the I/O terminals, the first output data path further being responsive to the data clock signal at the first latching input to transfer the data received from the first portion of the I/O terminals to the data terminals;

a second output data path coupled between the second portion of the I/O terminals and the data terminals, the second output data path including a second switching control terminal and a second latching input, the second output data path being responsive to a second switching signal at the second switching control terminal to receive data from the second portion of the I/O terminals, the second output data path further being responsive to the data clock signal at the second latching input to transfer the data received from the second portion of the I/O terminals to the data terminals;

a control circuit having a clock input coupled to the clock converter circuit, a first switching output coupled to the first switching control terminal, a second switching output coupled to the second switching control terminal, and a first control output coupled to the I/O interface, the control circuit being responsive to the commands and the internal clock signal to produce the first switching signal, the second switching signal and the read command signal; and a latch timing circuit including a clock input to which the data clock signal, may be applied a first latch output coupled to the first latching input and a second latch output coupled to the second latching input, the latch timing circuit being responsive to the data clock signal to provide the first and second latching signals in a predetermined sequence.

11. The memory device of claim 10 wherein the first output data path includes a first set of latches having a first half and a second half, each of the first and second halves including a respective group of interim latches coupled to respective ones of the I/O terminals, further including:

a first intermediate set of multiplexers having multiplexer outputs coupled to the data terminals, each multiplexer further including a first input coupled to the first group of interim storage latches and a second input coupled to the second group of interim storage latches.

12. The memory device of claim 11 wherein the second output data path includes a third set of latches having a third half and a fourth half, each of the third and fourth halves including a respective group of interim latches coupled to respective ones of the I/O terminals, further including:

a second intermediate set of multiplexers having multiplexer outputs coupled to the data terminals, each multiplexer further including a first input coupled to the third group of interim storage latches and a second input coupled to the fourth group of interim storage latches.

13. The memory device of claim 12 wherein the first and second multiplexers include first and second control inputs coupled to the first and second switching control terminals, respectively.

14. A data sequencing circuit for a synchronous memory device responsive to a first internal clock signal at a first phase, a data clock signal at any of a plurality of second phases different from the first phase, and externally supplied commands, comprising:

a plurality of I/O input terminals including a first portion and a second portion;

data terminals that may be coupled to a data bus;

a first output data path coupled between the first portion of the I/O terminals and the data terminals, the first output data path including a first switching control terminal and a first latching input, the first output data path being responsive to a first edge of the first clock signal at the first switching control terminal to receive data from the first portion of the I/O terminals, the first output data path further being responsive to the data clock signal at the first latching input to transfer the data received from the first portion of the I/O terminals to the data terminals; and a second output data path coupled between the second portion of the I/O terminals and the data terminals, the second output data path including a second switching control terminal and a second latching input, the second output data path being responsive to a second edge of the internal clock signal at the second switching control terminal to receive data from the second portion of the I/O terminals, the second output data path further being responsive to the data clock signal at the second latching input to transfer the data received from the second portion of the I/O terminals to the data terminals.

15. The data sequencing circuit of claim 14 wherein the first output data path includes a first set of latches having a first half and a second half, each of the first and second halves including a respective group of interim latches coupled to respective ones of the I/O terminals further including:

a first intermediate set of multiplexers having multiplexer outputs coupled to the data terminals, each multiplexer further including a first input coupled to the first group of interim storage latches and a second input coupled to the second group of interim storage latches.

16. The data sequencing circuit of claim 15 wherein the second output data path includes a third set of latches having a third half and a fourth half, each of the third and fourth halves including a respective group of interim latches coupled to respective ones of the I/O terminals, further including:

a second intermediate set of multiplexers having multiplexer outputs coupled to the data terminals, each multiplexer further including a first input coupled to the third group of interim storage latches and a second input coupled to the fourth group of interim storage latches.

17. The data sequencing circuit of claim 16 wherein the first and second multiplexers include first and second control inputs coupled to the first and second switching control terminals, respectively.

18. A computer system comprising:

a central processor;

a data bus;

a command bus;

input devices coupled to the central processor;

output devices coupled to the central processor;

a data clock source coupled to the central processor producing a data clock signal;

an external clock source coupled to the central processor and adapted to produce an external clock signal having a phase shift relative to the data clock signal;

a memory device responsive to the data clock signal and the external clock signal, the memory device including:

a memory array including a plurality of memory cells arranged in rows and columns;

an I/O interface coupled to the memory array, the I/O interface including a plurality of outputs each coupled to a respective column or row and a plurality of I/O terminals;

data terminals coupled to the data bus;

a multiplexing circuit having a set of multiplexer inputs each coupled to a respective data terminal, a plurality of first multiplexer outputs, and a plurality of first multiplexer outputs, the multiplexing circuit further including a control input terminal, the multiplexing circuit being responsive to a first control signal at the control input to couple the multiplexer inputs to the first multiplexer outputs and responsive to a second control signal at the control input to couple the multiplexer inputs to the second multiplexer outputs;

a first set of interim input storage latches, each having a first activation input, a first latch output and a first latch input, each first latch input being coupled to a respective first multiplexer output, each interim input storage latch in the first set being responsive to a first activation signal at the first activation input to latch data from the respective first multiplexer output;

a second set of interim storage latches, each having a second activation input, a second latch output and a second latch input, each second latch input being coupled to a respective second multiplexer output, each interim storage latch in the second set being responsive to a second activation signal at the second activation input to latch data from the respective second multiplexer output;

a first set of registers, each having a first load input, a first register input coupled to a respective first latch output and a first register output coupled to a respective I/O terminal, each register in the first set being responsive to a first load signal at the first load input to load data from the respective first latch output;

a second set of registers, each having a load input, a first register input coupled to a respective first latch output and a first register output coupled to a respective I/O terminal, each register in the second set being responsive to a second load signal at the second load input to load data from the respective second latch output; and a timing control circuit having a first clock input to which the external clock signal may be applied, a second clock input to which the data clock signal may be applied, a first load output coupled to the first load inputs, a second load output coupled to the second load inputs, a first control output coupled to the first control inputs, a second control output coupled to the second control inputs, a first activation output coupled to the first activation input, and a second activation output coupled to the second activation input, the timing control signal being responsive to the data clock signal to produce the first and second activation signals, the timing control signal further being responsive to the external clock signal to produce the first and second load signals.

19. The computer system of claim 18 wherein the first set of latches includes a first half and a second half, each of the first and second halves including a respective group of interim latches coupled to the data bus, wherein the memory device further includes:

a first intermediate set of multiplexers coupled between the first set of interim storage latches and the multiplexing circuit, each multiplexer in the first intermediate set having an intermediate multiplexer input coupled to the multiplexing circuit, a first intermediate multiplexer output coupled to a respective latch in the first half, and a second intermediate multiplexer output coupled to a respective latch in the second half.

20. The computer system of claim 19 wherein the second set of latches includes a third half and a fourth half, each of the third and fourth halves including a respective group of interim latches coupled to respective ones of the registers, the memory device further including a second intermediate set of multiplexers coupled between the third set of interim storage latches and the multiplexing circuit, each multiplexer in the second intermediate set having an intermediate multiplexer input coupled to the multiplexing circuit, a third intermediate multiplexer output coupled to a respective latch in the third half, and a fourth intermediate multiplexer output coupled to a respective latch in the fourth half.

21. The computer system of claim 20 wherein the timing control circuit is responsive to activate the first, second third and fourth halves in a predetermined sequence.

22. A method of transferring a byte of data having a first predetermined number of bits from a memory array to a data bus having a second predetermined number of lines, the method comprising the steps of:

providing a first clock signal at a first frequency;

dividing a selected clock cycle of the first clock signal into a plurality of cycle portions;

dividing the data into a plurality of parts, each part including a plurality of the bits;

at a first time transferring a first part of the data from the array to a first interim storage circuit;

storing the first part in the first interim storage circuit;

at substantially the first time, transferring a second part of the data from the array to a second interim storage circuit;

storing the second part in the second interim storage circuit;

during a first of the cycle portions, transferring the first part of the data from the first interim storage circuit to the data bus; and during a second of the cycle portions, transferring the second part of the data from the second interim storage circuit to the data bus.

23. The method of claim 22, further comprising the step of providing a second clock signal at the first frequency and with a phase shift relative to the first signal, wherein the step of transferring the first part of the data from the first interim storage circuit to the data bus is responsive to the second clock signal.

24. The method of claim 23 wherein the step of transferring the second part of the data from the second interim storage circuit to the data bus is responsive to the second clock signal.

25. A method of transferring a set of data from a set of I/O terminals including a first predetermined number of I/O terminals to a data bus having a second predetermined number of lines, the method comprising the steps of:

supplying the data to the I/O terminals responsive to a first clock signal;

dividing each clock cycle of the first clock signal into a plurality of cycle portions;

during a first of the cycle portions, storing a first portion of the data from a first portion of the I/O terminals;

during a second of the cycle portions, storing a second portion of the data from a second portion of the I/O terminals;

providing a respective latching signal during each of a plurality of the clock cycles, the latching signal having a phase shift relative to the first clock signal;

during the second of the cycle portions and responsive to the respective latching signal, transferring the first portion of the data to the data bus; and during a third of the cycle portions and responsive to the respective latching signal, transferring the second portion of the data to the data bus.

26. The method of claim 25 wherein the step of providing a latching signal during each of a plurality of the clock cycles includes the steps of:

producing a latch pulse responsive to the first clock signal;

providing an adjustment command; and adjusting the timing of the latch pulse relative to the first clock signal responsive to the adjustment command.

27. A method of transferring a set of data having a first predetermined number of bits from a data bus having a second predetermined number of lines less the predetermined number of bits to a memory array, the method comprising the steps of:

providing a data clock signal at a first frequency;

dividing a selected clock cycle of the data clock signal into a plurality of cycle portions;

dividing the set of data into a plurality of parts, each part including a plurality of the bits;

during a first of the cycle portions, storing a first part of the data in a first interim storage circuit;

during a second of the cycle portions, storing a second part of the data in a second interim storage circuit;

transferring the first part of the data from the first interim storage circuit to the array; and transferring the second part of the data from the second interim storage circuit to the array while transferring the first part of the data from the first interim storage circuit to the array.

28. The method of claim 27, further comprising the step of providing a second clock signal at the first frequency and with a phase shift relative to the first signal, wherein the steps of transferring the first parts of the data from the first interim storage circuit to the array is responsive to the second clock signal.

29. The method of claim 28 wherein the step of transferring the second part of the data from the second interim storage circuit to the array is responsive to the second clock signal.

30. A method of transferring a set of data from a data bus including a first predetermined number of lines to a set of I/O terminals having a second predetermined number of I/O terminals, wherein the data include the first predetermined number of bits, the method comprising the steps of:

providing a first clock signal;

providing a second clock signal, the second clock signal having a phase shift relative to the first clock signal;

supplying the data to the data bus responsive to the first clock signal;

at a first edge of the first clock signal, storing a first portion of the data from the data bus;

at a second edge of the first clock signal, storing a second portion of the data from the data bus;

dividing each clock cycle of the second clock signal into a plurality of cycle portions;

providing a respective latching signal during each of a plurality of the clock cycles;

during a first of the cycle portions and responsive to the respective latching signal, transferring the first portion to the I/O terminals; and during the first of the cycle portions and responsive to the respective latching signal, transferring the second portion of the data to the I/O terminals.

31. The method of claim 30, further including the steps of:

at a third edge of the first clock signal, storing a third portion of the data; and during the first of the cycle portions, transferring the third portion of the data to the I/O terminals.

32. The method of claim 31 further including the steps of:

at a fourth edge of the first clock signal, storing a fourth portion of the data; and during the first of the cycle portions, transferring the fourth portion of the data to the I/O terminals.

33. The method of claim 32 wherein the steps of transferring the third portion of the data to the I/O terminals and transferring the fourth portion of the data to the I/O terminals are both responsive to the respective latching signals.

* * * * *

UNITED STATES PATENT AND TRADEMARK OFFICE
CERTIFICATE OF CORRECTION

PATENT NO. : 5,831,929
DATED : November 3, 1998
INVENTOR(S) : Troy A. Manning

It is certified that error appears in the above-identified patent and that said Letters Patent is hereby corrected as shown below:

In column 12, claim 1, line 3, following the first instance of "input" please insert --,--.

In column 12, claim 1, line 29, following "signal" please insert --may be applied--.

In column 13, claim 6, line 63, following "signal" please insert --may be applied--.

In column 13, claim 6, line 63, following "input" please insert --adapted to receive--.

In column 13, claim 6, line 63, (1st occurrence), please delete "to which".

In column 15, claim 10, line 21, please delete ",".

In column 15, claim 10, line 21, immediately following "applied" please insert --,--.

In column 16, claim 15, line 21, immediately following "terminals" please insert --,--.

Signed and Sealed this

Eighteenth Day of May, 1999

Attest:

Q. TODD DICKINSON

*Attesting Officer*  Acting Commissioner of Patents and Trademarks